United States Patent [19]

Frederiksen

[11] 4,336,489
[45] Jun. 22, 1982

[54] ZENER REGULATOR IN BUTTED GUARD BAND CMOS

[75] Inventor: Thomas M. Frederiksen, San Jose, Calif.

[73] Assignee: National Semiconductor Corporation, Santa Clara, Calif.

[21] Appl. No.: 164,851

[22] Filed: Jun. 30, 1980

[51] Int. Cl.³ .................... H01C 27/04; G05F 3/18
[52] U.S. Cl. .................................... 323/231; 357/13;
357/35; 357/42; 357/86; 357/23
[58] Field of Search .................. 307/304, 297, 296 R;
357/42, 35, 13; 323/231

[56] References Cited

U.S. PATENT DOCUMENTS 4,006,491  2/1977  Alaspa et al. ..................... 357/42

OTHER PUBLICATIONS

Davis, IEEE J. of Solid State Circuits, vol. Sc 8, No. 6, Dec. 1973, pp. 419–423.

*Primary Examiner*—William D. Larkins
*Attorney, Agent, or Firm*—Gail W. Woodward; James A. Sheridan; Neil B. Schulte

[57] ABSTRACT

Butted guard band CMOS circuits have a typical breakdown of about 7 volts. It is often desirable to operate circuitry from supplies greater than 7 volts. For example, 9 volts is a commonly used supply value. An isolated zener diode is fabricated into a CMOS integrated circuit so as to develop a voltage drop equal to guard band breakdown. The zener voltage is coupled by way of a diode-connected transistor to the operating circuitry. The diode drop substracts from the zener voltage so that the circuitry is always operated at a voltage below its breakdown.

9 Claims, 2 Drawing Figures

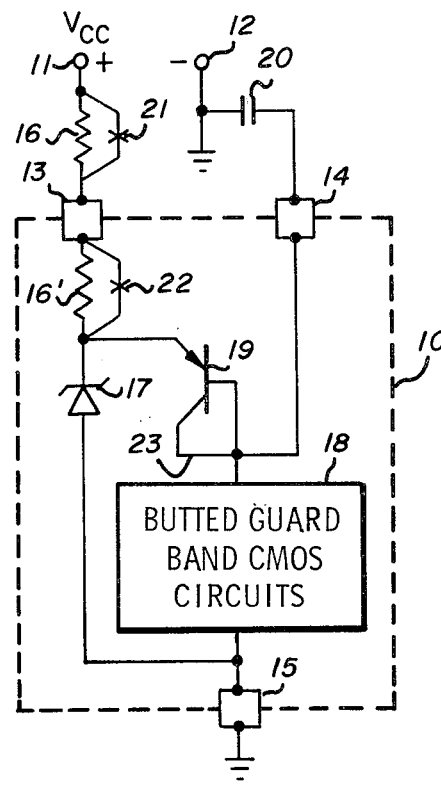
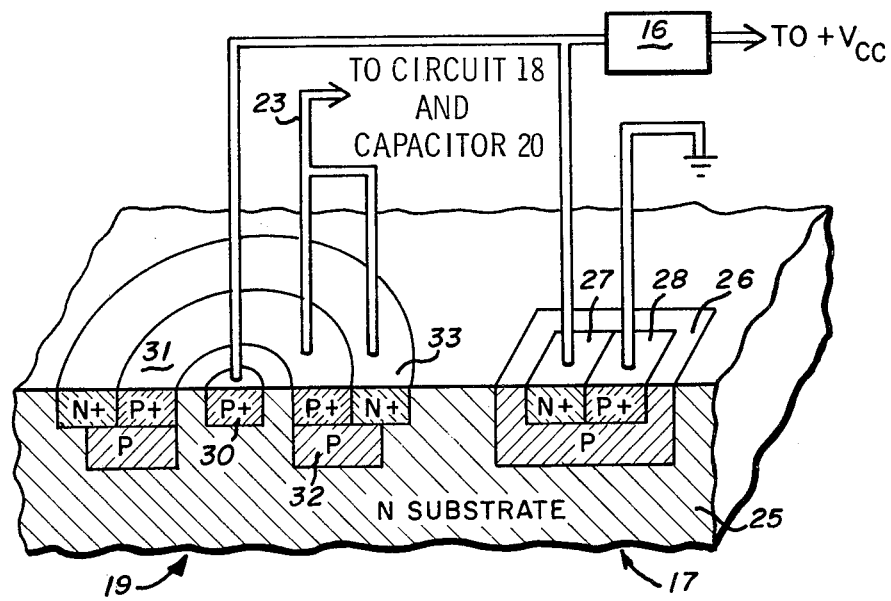

ZENER REGULATOR IN BUTTED GUARD BAND CMOS

BACKGROUND OF THE INVENTION

The invention relates to the well-known butted guard band complementary metal oxide semiconductor (CMOS) monolithic integrated circuit (IC) devices. Since relatively heavily doped P and N regions abut each other, the breakdown voltage is relatively low. However, it is often desirable to operate such circuits along with other devices that operate at higher voltages. For example, many circuits are designed to operate from 9-volt batteries and it is often useful and desirable to connect them to CMOS devices. However, the butted guard bands result in a typically 7-volt breakdown. Without current limiting, a 9-volt supply can destroy the devices. On the other hand, the butted guard band form of CMOS construction is often used to make high density ICs which are economical to fabricate and use.

Accordingly, it would be highly desirable to incorporate an on-chip voltage limiter that would reliably avoid overvoltage problems.

SUMMARY OF THE INVENTION

It is an object of the invention to provide a voltage limiter for butted guard band CMOS structures.

It is a further object of the invention to employ butted guard band elements in a CMOS structure to develop a breakdown related voltage and to operate the circuitry at a slightly lower voltage.

It is a still further object of the invention to create an on-chip CMOS butted guard band voltage limiter that operates below the breakdown level so that high operating voltages can be applied without damage.

These and other objects are achieved as follows. A zener diode is created in an isolated region using butted guard band elements so that the zener voltage equals the circuit breakdown. A nearby lateral transistor is created to have a high collector efficiency and the collector and base connected together. The lateral transistor emitter is connected to the zener diode cathode so that the potential at the base (and collector) is one diode drop below the zener voltage. Since the CMOS substrate is directly connected to the collector-base structure, it is automatically at a level below breakdown. Since lateral transistors are relatively slow acting, a bypass capacitor can be connected between the transistor collector-base connection and the zener diode anode. In operation, a voltage dropping resistor is connected between the zener diode cathode and the positive supply terminal. In such an arrangement, a 7 volt butted guard band circuit will be operated at about 6.4 volts using supply voltages well over 7 volts.

BRIEF DESCRIPTION OF THE DRAWING

FIG. 1 is a schematic diagram showing the circuit of the invention.

FIG. 2 is a partial cross-section front elevation view of a butted guard band IC using the invention.

DESCRIPTION OF THE INVENTION

In the schematic diagram of FIG. 1, the IC-related portion of the circuit is shown inside dashed outline 10. The circuit is operated from a power source connected between $+V_{CC}$ terminal 11 and grounds 12 and 15. Three bonding pads are shown for the IC at 13, 14, and 15 for external connections. It is to be noted that voltage dropping resistor 16 is shown as an external part. However, it could be an on-chip component, in which case pad 13 would connect directly to $+V_{CC}$.

The heart of the circuit is zener diode 17 which is made to have the same breakdown as the circuits 18 which are of conventional CMOS butted guard band construction.

Transistor 19 is diode connected by link 23. The diode is poled so as to be forward biased and is coupled between the zener diode and the circuits 18. The voltage drop across transistor 19 is typically about 0.6 volt so that the circuits at 18 are operated at about 0.6 volt below diode 17. This insures that the circuits 18 will be subjected to lower than breakdown voltages. If the voltage at terminal 11 is below the breakdown level, circuits 18 will merely see a voltage level slightly below the supply level but otherwise will be operative.

Since CMOS circuits impose current surges on the supply during their switching transition, their operation will produce narrow voltage spikes at pad 14. Since transistor 19 is of PNP lateral construction, it will not respond to very rapid transients even though forward biased. For this reason, capacitor 20 is connected to bypass the base-collector electrodes to ground. This connection requires an extra pad at 14 to accommodate capacitor 20. The capacitor, while large relative to on-chip capacitors, is relatively small by discrete component standards. Typically, capacitor 20 will be about 0.05 to 0.1 microfarads and rated at about 10 to 12 volts.

Resistor 16 is selected for the supply voltage involved. For example assuming a 9-volt battery supply and a 7-volt zener 17, resistor 16 will have to drop about 2 volts. Assuming a 1 milliampere drain in circuits 18 and about 0.5 milliampere in zener diode 17, resistor 16 would be about 1.3 kohms.

Resistor 16 is shown in two parts, an off chip portion 16 and an on chip portion $16^1$. Both are shown as having severable jumpers. If the jumper around resistor 16 is severed at 21, the off chip version is present. If the jumper around resistor $16^1$ is severed at 22, the on chip version is present. Normally only one jumper will be severed at 21 or 22. However, both jumpers can be severed at 21 and 22, so that both on chip and off chip resistors are present.

The on chip resistor portion $16^1$ can be in the form of an ion implanted or diffused resistor of conventional construction. Alternatively, it can be in the form of a resistance metal located on top of the IC field oxide. In either case, provision for laser trimming of the resistor can be made.

FIG. 2 shows an IC embodiment of the circuit of FIG. 1. The drawing is not to scale but is exaggerated vertically to show the structure more clearly. Furthermore, the usual surface oxide along with the metallization has been removed for clarity. Such elements are conventional well-known state-of-the-art devices. The fragment of IC depicted is preferably near an edge or corner of the IC chip well away from circuits 18.

Substrate 25 is the usual N type CMOS wafer. P well 26 is of the conventional construction used for N channel transistors. Zener diode cathode 27 is an N+ doped region of the kind normally used to create N channel transistor sources and drains. Zener diode anode 28 abuts cathode 27 and is a P+ doped region of the kind normally used to create P channel transistor sources and drains.

Transistor 19 is located near diode 17 and is electrically isolated therefrom by P well 26, which creates a back-biased junction against substrate 25. Emitter 30 is also a P+ region of the kind normally used to create P channel transistor sources and drains. Emitter 30 is closely surrounded by collector 31, which is also of P+ construction. N+ region 33 acts as the transistor 19 base contact. Since the metallization of the IC is shown schematically, connection 23 is shown shorting regions 31 and 33 together for the base-collector connection of FIG. 1. Actually, N+ region 33 is ohmically connected to substrate 25 and this will serve as the connection to the other circuits. However, as a practical matter, connection 23 can be extended as metallization to provide a low resistance circuit connection as shown. Thus, to make ohmic contact to the substrate 25, it is necessary for N+ region 33 to substantially overhang P region 32.

To improve the collector efficiency of transistor 19, a two-part collector structure is employed. A P well doped region 32 is located under collector 31 and is ohmically connected thereto. Since the P well 32 extends further into substrate 25, it is fairly certain that any minority carriers injected by emitter 30 will be collected by collector 31 or 32.

As a practical matter, by locating the emitter and collector in closely confronting relationship, most of the emitter injected carriers will flow laterally and will be collected directly. Any carriers that are injected vertically downward will be recombined in the substrate. Carriers that are injected mostly downward, but with a lateral component, will be largely collected by collector portion 32. Thus, very few of the carriers injected by emitter 30 will diffuse through th bulk of substrate 25 where they can interact with other IC components. Finally, since the elements 17 and 19 are in a relatively remote location, towards the edge or corner of the IC chip, this isolation of the circuit eliminates any of the previously mentioned detrimental interaction with other IC components.

In the absence of the above measures, it would appear at first glance that only a forward biased diode would be needed where transistor 19 is located. Using discreet components, this is true. It might, therefore, be thought that all that is needed is a P region such as emitter 30 alone, operating against substrate 25. This would suffice for obtaining the 0.6 volt diode drop described above. However, if this were to be implemented in an IC chip, such a diode would inject minority carriers into substrate 25 in profusion. These carriers would then diffuse outward where they could be collected at P wells in circuitry 18. Such minority carrier injection and collection can interfere with the operation of the CMOS circuits.

The invention has been described and a preferred embodiment detailed. When a person skilled in the IC art reads the foregoing description, alternatives and equivalents within the spirit and intent of the invention will occur to him. Accordingly, it is intended that the scope of the invention be limited only by the following claims.

I claim:

1. A voltage limiting circuit for use in butted guard band CMOS integrated circuit chip structures that may be operated at supply voltages in excess of the breakdown voltage of said structures, said butted guard band structures including relatively heavily doped P and N type regions located respectively within lightly doped substrate material and acting to prevent surface inversion layers in said lightly doped substrate material, said relatively heavily doped P and N regions abutting each other, said circuit chip comprising:
   an isolated zener diode having first and second electrodes and having a reverse biased breakdown voltage substantially equal to the breakdown voltage of said butted guard band structures;
   means for coupling said first diode electrode to the first terminal of said supply voltage;
   voltage dropping means for coupling said second diode electrode to the second terminal of said supply voltage; and
   a lateral transistor having heavily doped collector and emitter regions of said one conductivity type spaced apart laterally on the surface of said chip and separated by a base region of opposite conductivity type, said emitter being coupled to said second diode electrode and said base and collector being coupled together and to the operating circuitry on said chip structure.

2. The circuit of claim 1 wherein said voltage dropping means comprise an off-chip resistor.

3. The circuit of claim 1 wherein said voltage dropping means comprise an on-chip resistor.

4. The circuit of claim 1 in further combination with a bypass capacitor coupled between said base and collector of said lateral transistor and said first electrode of said zener diode.

5. A monolithic integrated circuit incorporating CMOS butted guard band operating circuitry having a combination of P channel and N channel transistors and being characterized as having abutting relatively heavily doped P and N regions that serve to prevent surface inversion in said circuit, said circuit comprising:
   a semiconductor substrate of a first conductivity type and having a major surface;
   a region of opposite conductivity type located in said substrate;
   a zener diode having first and second electrodes of the same material as said guard bands located inside said region of opposite conductivity type;
   a lateral transistor located adjacent to said region of opposite conductivity type, said lateral transistor having an emitter region of said zener diode first electrode material, a collector of the same material as said zener diode first electrode material closely confronting and surrounding said emitter thereby creating a lateral base region between the closely confronting emitter and collector and a base contact of the same material as said zener diode second electrode surrounding said collector;
   means for shorting said base contact to said collector;
   means for coupling said transistor emitter to said zener diode second electrode; and
   means for coupling said zener diode to a source of reverse bias potential.

6. The integrated circuit of claim 5 further comprising a region of said opposite conductivity type extending below said lateral transistor collector into said substrate.

7. The integrated circuit of claim 6 wherein said substrate is of N type conductivity, said opposite conductivity region is a CMOS P well, said zener diode first electrode material is of a P channel transistor source and drain material, and said zener diode second electrode is of N channel transistor source and drain material.

8. The integrated circuit of claim 7 further comprising means for coupling said zener diode first electrode material to the negative terminal of source of operating potential and means for coupling said zener diode second electrode material to the positive terminal of said source of operating potential.

9. The integrated circuit of claim 8 wherein said last named means includes a resistor.

* * * * *